United States Patent [19]

Bashir et al.

[11] Patent Number: 5,397,722
[45] Date of Patent: Mar. 14, 1995

[54] PROCESS FOR MAKING SELF-ALIGNED SOURCE/DRAIN POLYSILICON OR POLYSILICIDE CONTACTS IN FIELD EFFECT TRANSISTORS

[75] Inventors: Rashid Bashir, Santa Clara; Francois Hebert, Sunnyvale, both of Calif.

[73] Assignee: National Semiconductor Corporation, Santa Clara, Calif.

[21] Appl. No.: 273,534

[22] Filed: Jul. 11, 1994

Related U.S. Application Data

[62] Division of Ser. No. 213,360, Mar. 15, 1994.

[51] Int. Cl.$^6$ ............................................ H01L 21/335
[52] U.S. Cl. ..................... 437/41; 437/162; 437/186; 437/193; 437/200; 437/984; 748/DIG. 20
[58] Field of Search ............... 437/41, 44, 203, 912, 437/228, 229, 162, 186, 187, 193, 200, 40; 257/408, 412, 413

[56] References Cited

U.S. PATENT DOCUMENTS

| | | |
|---|---|---|
| 4,188,707 | 2/1980 | Asano et al. |
| 4,577,392 | 3/1986 | Peterson ............ 437/44 |
| 4,625,391 | 12/1986 | Sasaki ............ 437/200 |
| 4,697,333 | 10/1987 | Nakahara . |
| 4,753,709 | 6/1988 | Welch et al. |
| 4,971,922 | 11/1990 | Watabe et al. |
| 4,980,738 | 12/1990 | Welch et al. |
| 4,980,739 | 12/1990 | Favreau . |
| 5,200,352 | 4/1993 | Pfiester ............ 437/44 |
| 5,254,490 | 10/1993 | Kondo ............ 437/44 |
| 5,256,586 | 10/1993 | Choi et al. ............ 437/44 |
| 5,320,974 | 6/1994 | Hori et al. ............ 437/44 |

FOREIGN PATENT DOCUMENTS

| | | |
|---|---|---|
| 58-123724 | 7/1983 | Japan . |
| 61-20369 | 1/1986 | Japan ............ 437/41 |
| 61-20370 | 1/1986 | Japan . |
| 63-12168 | 1/1988 | Japan . |
| 3-120835 | 5/1991 | Japan ............ 437/44 |
| 5-74814 | 3/1993 | Japan ............ 437/912 |

OTHER PUBLICATIONS

Yamaguchi, et al., "0.5-$\mu$m Bipolar Technology Using a New Base Formation Method: SST1C," IEEE 1993 Bipolar Circuits and Technology Meeting 4.2, 1993, pp. 63–66.

Iranmanesh, et al., "A 0.8-$\mu$m Advanced single-Poly BiCMOS Technology for High-Density and High-Performance Applications," IEEE Journal of Solid-State Circuits, vol. 26, No. 3, Mar., 1991, pp. 422–426.

Yamaguchi, et al., "Process Integration and Device Performance of a Submicrometer BiCMOS with 16-GHzf, Double Poly-Bipolar Devices," IEEE Transactions on Electron Devices, vol. 36, No. 5, May, 1989, pp. 890–896.

Chiu, et al., "Non-overlapping Super Self-Aligned BiCMOS with 87ps Low Power ECL," IEDM, 1988, pp. 752–755.

Primary Examiner—T. N. Quach
Attorney, Agent, or Firm—H. Donald Nelson; David T. Millers; Richard J. Roddy

[57] ABSTRACT

A process for forming field effect transistors having self-aligned source/drain contact includes: forming an gate overlying a portion of a semiconductor; forming a first sidewall spacer on the gate; forming a source/drain region in the semiconductor; depositing a conductive layer over the semiconductor so that a step is formed in the conductive layer in a region overlying the gate and the first sidewall spacer; forming a second sidewall spacer on the step; forming a protective layer over a portion of the conducting layer not covered by the second sidewall spacer; removing the second sidewall spacer to expose a portion of the conductive layer but leave covered a portion of the conductive layer underlying the protective layer; and removing the exposed portion of the conductive layer to leave a portion of the conductive layer in contact with the source/drain region and electrically isolated from the gate. The portion of the conductive layer left is the self-aligned contact. Typically, the conductive layer is polysilicon but may alternatively be polysilicide or silicide.

18 Claims, 4 Drawing Sheets

PROCESS FOR MAKING SELF-ALIGNED SOURCE/DRAIN POLYSILICON OR POLYSILICIDE CONTACTS IN FIELD EFFECT TRANSISTORS

This application is a continuation of application Ser. No. 08/213,360, filed Mar. 15, 1994.

CROSS-REFERENCES TO RELATED APPLICATIONS

This application is related to and incorporates by reference U.S. patent application Ser. No. 08/273,530, by Rashid Bashir and Francois Hebert, entitled "Self-aligned Polysilicon Base Contact in a Bipolar Junction Transistor", co-filed with the present application.

BACKGROUND OF THE INVENTION

1. Field of the Invention

This invention relates to field effect transistors and processes for making field effect transistors and in particular to processes which use selective removal of sidewall spacers and a portion of an underlying conductive layer to isolate self-aligned source/drain contacts from gates.

2. Description of Related Art

Field effect transistors are common integrated circuit elements having many uses. FIG. 1 shows an example of a prior art field effect transistor 100 having a source 102 and a drain 103 formed in a silicon substrate 101. Substrate 101 contains P-type dopants such as boron, and source 102 and drain 103 are heavily doped with N-type dopants such as arsenic. A channel region 105 of substrate 101 may optionally be lightly doped with N-type dopants to alter the threshold voltage of transistor 100. A polysilicon gate 104 overlies channel region 105 and is separated from substrate 101 by an insulating gate oxide 106. External voltages are applied to source 102 and drain 103 via metal source/drain contacts 122 and 123 and polysilicon source/drain contacts 112 and 113.

Manufacturing constraints limit the minimum size of transistor 100. For example, for an operable transistor, polysilicon contacts 112 and 113 must be separated from gate 104. If gate 104 and contacts 105 are formed using two separate masks, the designed separations between gate 104 and contacts 112 and 113 must be large enough to accommodate expected misalignment between masks. The potential for misalignment requires that active regions 102 and 103 in substrate 101 be larger than the minimal operable size by at least the expected misalignment between masks. Accordingly, manufacturing processes which eliminate misalignment between gate and contact masks could reduce active region size.

SUMMARY OF THE INVENTION

In accordance with the present invention, transistors and processes for forming transistors are provided. A typical transistor in accordance with the invention includes a polysilicon, polysilicide, or silicide source/drain contact which is self-aligned with a fixed separation from a polysilicon, polysilicide, or silicide gate. A first layer forms the gate, and a second layer forms the source/drain contact. A process for aligning the source/drain contact with the gate uses a step in a portion of the second layer overlying the gate. A spacer is formed on a sidewall of the step and therefore is self-aligned with the gate. A protective layer is then formed on portions of the second layer not cover by the spacer. By selectively removing the spacer and the underlying portion of the second layer, source/drain contacts are electrically isolated from the gate.

The separation between the source/drain contact and the gate is controlled by the thickness the second layer and the thickness of the spacer formed on the second layer. Another sidewall spacer formed on the gate before the second layer can provide additional separation. The separation between the source/drain contacts and the gate is not subject to alignment error between masks because the spacers which define the separation are self-aligned with the gate. Accordingly, the active regions in transistors in accordance with this embodiment of the present invention can be made smaller than in prior art transistors without self-aligned contacts.

Additionally, the process for forming transistors in accordance with the present invention contains many of the processing steps and layers used in forming bipolar transistors as disclosed in co-filed U.S. patent application entitled "Self-Aligned Polysilicon Base Contact in a Bipolar Junction Transistor" incorporated by reference above. The processes disclosed may be easily incorporated into a Bi-CMOS process for fabrication of integrated circuits.

One embodiment in accordance with the invention is a process which includes: forming an gate overlying a portion of a semiconductor surface; forming a first sidewall spacer adjacent to the gate; forming a source/drain region in the semiconductor surface; depositing a conductive layer over the source/drain region, the first sidewall spacer, and the gate such that a step is formed in the conductive layer in a region over the gate and the first sidewall spacer; forming a second sidewall spacer adjacent to the step; forming a protective layer over a portion of the conducting layer not covered by the second sidewall spacer; removing the second sidewall spacer to expose a portion of the conductive layer covered by the second spacer; and removing the exposed portion of the conductive layer to leave a portion of the conductive layer in contact with the source/drain region and electrically isolated from the gate.

Typically, the semiconductor surface is a surface of a silicon substrate, and the gate and conductive layer are doped polysilicon layers formed overlying the silicon substrate. The source/drain region is typically formed in the silicon substrate by ion implantation and/or diffusion using either the gate alone or the gate and the first spacer as a mask. The dopant concentration of the source/drain region may be increased or decreased by diffusion of dopants from the conductive layer. The compositions of the second sidewall spacer and the protective layer are chosen so that a selective etch removes the second sidewall spacer but leaves the protective layer intact. Typically, the second sidewall spacer is made of silicon nitride while the protective layer is made of silicon dioxide.

BRIEF DESCRIPTION OF THE DRAWINGS

Similar or identical items in different figures have the same reference symbols.

DETAILED DESCRIPTION OF THE PREFERRED EMBODIMENTS

Figure 1:
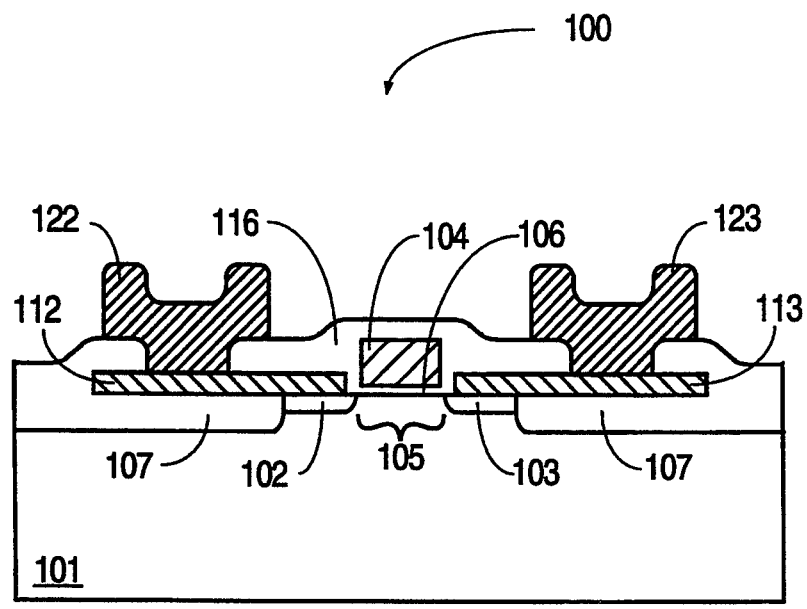
FIG. 1 shows a cross-sectional view of a prior art transistor.
Figure 2:
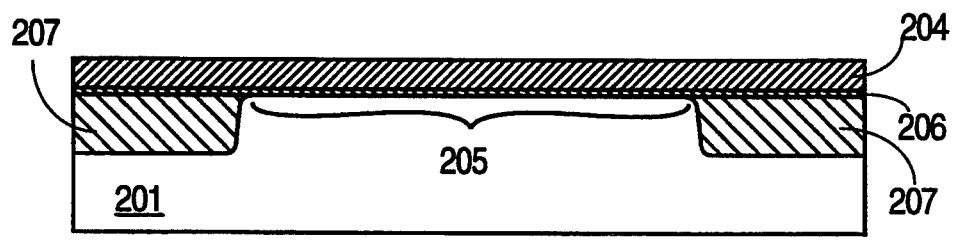
FIG. 2 shows a shows a cross-sectional view of a structure including a substrate, a gate oxide layer, and a first polysilicon layer used to form portions of a transistor in accordance with the present invention.

In accordance with an embodiment of the present invention, a transistor is formed using a double-poly process. FIG. 2 shows a shows a cross-sectional view of a structure including a semiconductor substrate 201, a gate oxide layer 206, and a conductive layer 204 which form portions of an n-channel enhancement mode field effect transistor in accordance with an embodiment in the present invention.

In the embodiment of FIG. 2, substrate 201 is a monocrystalline silicon substrate containing a P-type dopant such as boron at a concentration between about $1 \times 10^{16}$ and $5 \times 10^{17}$ cm$^{-3}$. Substrate 201 has been processed using well known techniques such as masking and thermal oxide growth to form field oxide regions 207 and an active region 205. Field oxide regions 207 help to isolate active region 205 from circuit elements (not shown) formed elsewhere on the surface of substrate 201.

A thin high quality gate oxide 206 between about 80 and about 400 Å thick is grown or deposited overlying substrate 201. In an alternative embodiment, another insulating material may be used in place of gate oxide 206. An optional threshold adjust implant of substrate 201 may be performed either before or through gate oxide layer 206. Typically, the threshold adjust implant creates lightly doped N- region close to the surface of substrate 201.

In the embodiment of FIG. 2, conductive layer 204 is polysilicon (polycrystalline silicon) formed on substrate 201 to a thickness between about 0.2 and about 0.4 μm using well known chemical vapor deposition (CVD) techniques. Layer 204 is implanted or diffused with an N type dopant such as arsenic to a dopant concentration of about $1 \times 10^{20}$ to about $1 \times 10^{21}$ cm$^{-3}$. Optionally, a silicide layer may be formed on layer 204 to reduce resistance and condition layer 204 for metal contacts. In an alternative embodiment, conductive layer 204 may be silicide or another conductive material. Silicide layers comprising metal-silicon compounds such as tungsten silicide ($WSi_x$), titanium silicide ($TiSi_x$), cobalt silicide ($CoSi_x$), or molybdenum silicide ($MoSi_x$) can be formed using well known techniques such as sputtering from a silicon compound target.

Figure 3:
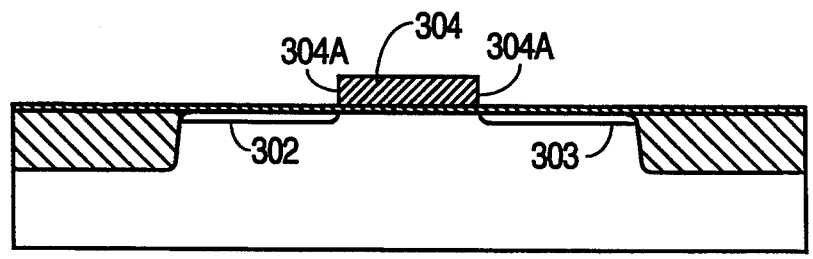
FIG. 3 shows a cross-sectional view of the structure of FIG. 2 after masking and etching to form a polysilicon gate.

FIG. 3 shows a cross-sectional view of the structure of FIG. 2 after masking and etching polysilicon layer 204 to form a polysilicon gate 304. The masking is preformed using well known photolithography techniques.

The size of the gate region depends on the lithography equipment and design rules used. A conventional anisotropic etching technique such as reactive ion etching (RIE) or plasma using etching removes unwanted polysilicon and leaves polysilicon gate 304. RIE etching of polysilicon typically employs gases such as carbon-tetrafluoride or chlorine. RIE forms sidewalls 304A which are nearly perpendicular to the surface of substrate 201 and therefore facilitates formation of sidewall spacers (disclosed below) on sidewalls 304A.

An N-type implant forms a lightly doped source region 302 and a lightly doped drain region 303. As is well known, a voltage applied to regions 302 and 303 determines which region 302 or 303 acts as the source of the field effect transistor and which region 303 or 302 acts as the drain. Absent an applied voltage, designation of region 102 as the source and region 103 as the drain is somewhat arbitrary and used herein to distinguish one current carrying region or terminal from another current carrying region or terminal. The term "source/drain" is used herein to indicate structures that can either be the source or the drain.

The implant which forms lightly doped source/drain regions 302 and 303 uses polysilicon gate 304 as a mask. Accordingly, lightly doped source/drain regions 302 and 303 are aligned with the edges of gate 304. Typically, lightly doped source/drain regions 302 and 303 have a dopant concentration between about $1 \times 10^{18}$ and about $5 \times 10^{19}$ cm$^{-3}$ and an initial depth of about 0.05 and about 0.1 μm.

Figure 4:
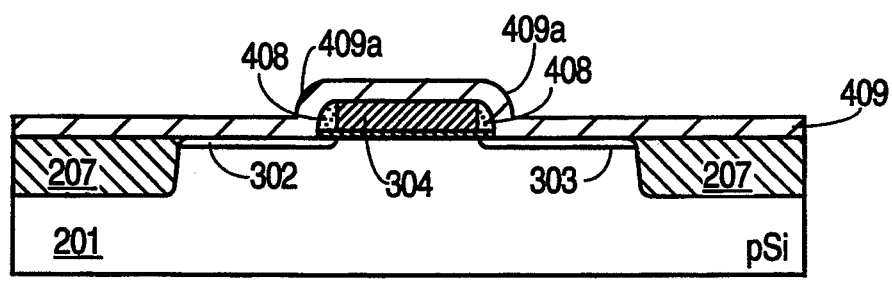
FIG. 4 shows a cross-sectional view of the structure of FIG. 3 after formation of a first sidewall spacer and a second polysilicon layer.

Sidewall spacers 408 in FIG. 4 are formed on sidewalls 304A of gate 304. In this embodiment, sidewall spacers 408 are made of silicon dioxide and may be formed by depositing an original oxide layer between about 0.15 and 0.3 μm thick using CVD and then etching the original oxide layer using an anisotropic etch such as RIE using $CHF_3$ and $C_2F_6$, or $CHF_3$ and $O_2$, or $CF_4$ and $H_2$ to remove most of the oxide layer. The thickness of the original oxide layer along the direction of the anisotropic etch is greatest adjacent to gate 304, so that if the time of the anisotropic etch is properly controlled, sidewall spacers 408 are left when the rest of the original oxide layer is removed.

Alternatively, spacers 408 may be formed of silicon nitride or another insulating material which protects gate 304 while a portion of a second polysilicon layer 409 is removed as disclosed below. The etching time for formation of a sidewall spacer depends on the thickness of the original layer, the composition of the original layer, and the type of etch used. Processes for forming sidewall spacers are well known in the art.

Polysilicon layer 409 is deposited to a thickness between about 0.15 and about 0.3 μm over source/drain regions 302 and 303, spacers 408, and gate 304 using well known CVD techniques. Optionally, a silicide layer can be formed on top surface of polysilicon layer 409 to reduce resistance and condition polysilicon layer 409 for metal contacts disclosed below. The silicide layer is formed using well known techniques such as sputtering or evaporating a thin layer of metal onto the polysilicon layer 409 and then heating to form silicide. Polysilicon layer 409 is then implanted with an N-type dopant to concentration of about $1 \times 10^{19}$ to about $1 \times 10^{21}$ cm$^{-3}$ which makes polysilicon layer 409 Conductive. In an alternative embodiment, a silicide layer 409 may be formed in place of polysilicon layer 409. Silicide layers can be formed using well known techniques such as disclosed above.

Figure 5:
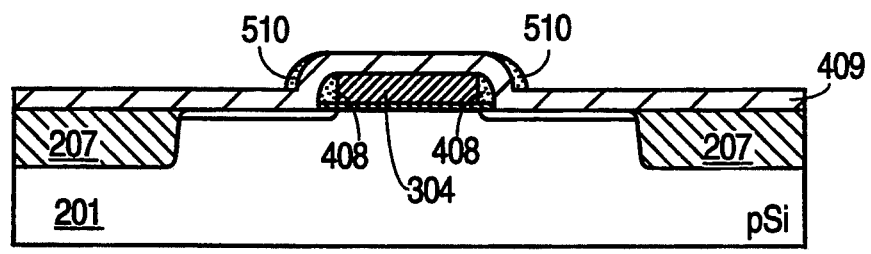
FIG. 5 shows a cross-sectional view of the structure of FIG. 4 after formation of a second sidewall spacer.

Because the contour of layer 409 follows the underlying structure, there is a step in layer 409 in a region overlying gate 304. Sidewall spacers 510 are formed on sidewalls 409A of the step in polysilicon layer 409 as shown in FIG. 5. In the embodiment of FIG. 5, spacers 510 are silicon nitride. Such spacers may be formed by CVD of a 500 Å layer of silicon nitride then an anisotropic etch of the silicon nitride layer to expose portions of polysilicon layer 409. RIE using an etch such as $Cl_2$ and $O_2$, or $CHF_3$ and $O_2$, or $SF_6$ and $O_2$ which is selective to polysilicon provides the desired spacers 510.

Figure 6:
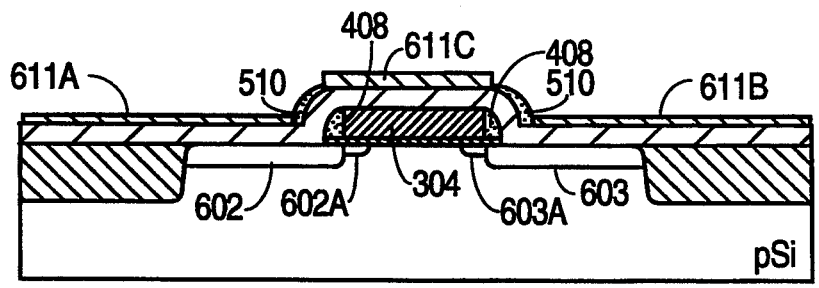
FIG. 6 shows a cross-sectional view of the structure of FIG. 5 after formation of a protective layer on the second polysilicon layer.

After formation of spacers 510, a protective layer including regions 611A, 611B, and 611C, shown in FIG. 6, are formed on exposed portions of polysilicon layer 409. In the embodiment of FIG. 6, regions 611A, 611B, and 611C are silicon dioxide which is thermally grown on polysilicon layer 409. Thermal oxide does not grow on nitride spacers 510.

The thermal process which forms oxide regions 611A, 611B, and 611C causes diffusion of dopants. Heavily doped N+ source/drain regions 602 and 603 having a depth of between about 0.1 and 0.2 $\mu$m in silicon substrate 201 are formed by N type diffusion from polysilicon layer 409. Lightly doped source/drain regions 602A and 603A remain under spacers 408. Lightly doped source/drain regions 602A and 603A cause a more gradual change in the dopant concentration in the areas of substrate 201 nearest the edges of gate 304. The more gradual change in dopant concentration reduces the magnitude of the electric field near the edges of gate 304 when the transistor is in operation and desirably reduces hot electron effects.

To control the amount of diffusion during growth of protective regions 611A, 611B, and 611C, a high pressure oxidation (HIPOX) process can be used. HIPOX reduces the time required to grow protective regions 611A, 611B and 611C and thereby limits the amount of diffusion. For example, the protective oxide layer may be grown by exposing polysilicon layer 409 (and the rest of the structure shown in FIG. 6) to oxygen or water vapor at about 25 atmospheres and 850° to 950° C. for about 1 to 10 minutes.

Figure 7:
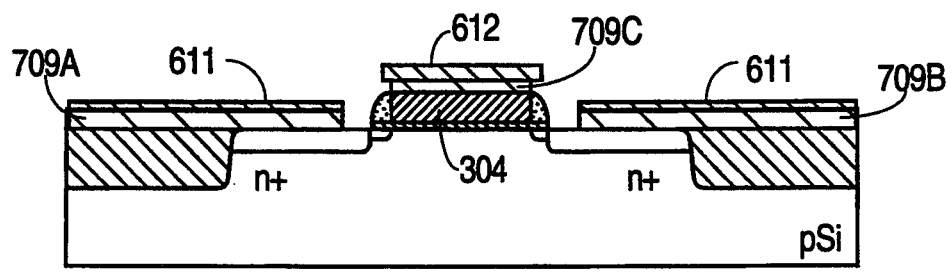
FIG. 7 shows a cross-sectional view of the structure of FIG. 6 after etching to remove the second spacer and portions the second polysilicon layer under the second spacer.

Nitride spacers 510 are removed using an etch such as hot (approximately 150°–180° C.) phosphoric acid ($H_3PO_4$) which is selective to silicon oxide so that protective regions 611A, 611B, and 611C remain substantially intact. Removing nitride spacers 510 exposes a portion of polysilicon layer 409 which was adjacent to and below spacers 510. The size of the exposed portion is controlled by the size of spacers 510. The exposed portion of polysilicon layer 409 is removed using an isotropic etch such as a wet etch or a plasma etch to electrically isolate polysilicon source/drain contacts 709A and 709B from gate 304 as shown in FIG. 7. A polysilicon region 709C becomes part of polysilicon gate 304.

Protective regions 611A, 611B, and 611C may be removed using a selective etch, and silicide can be formed on polysilicon contacts 709A and 709B if silicide was not previously formed. If silicide was previously formed as disclosed above, protective regions 611A, 611B, and 611C need not be removed.

Figure 8:
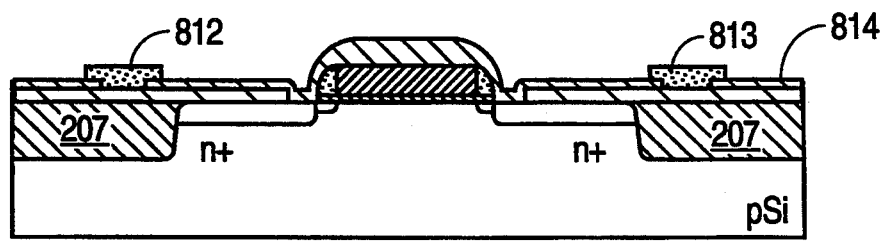
FIG. 8 shows a cross-sectional view of the structure of FIG. 7 after formation of an insulating layer and metal contacts.

As shown in FIG. 8, a low temperature oxide (LTO) layer 814 approximately 0.2 to 0.4 $\mu$m thick is deposited by CVD over polysilicon source/drain contacts 709A and 709B, substrate 201, and polysilicon gate 304. Openings for metal contacts including metal source/drain contacts 812 and 813 are then formed through oxide layer 814. Silicide can be formed on the silicon exposed by the openings before metal is deposited. Such formation of silicide may not be necessary if silicide was previously formed on polysilicon layer 409 as disclosed above in regard to FIG. 4. Metal source/drain contacts 812 and 813 and a gate contact (not shown) are formed using well known techniques. Metal contacts 812 and 813 may be formed over field oxide region 207 to reduce capacitance in the transistor.

Figure 9:
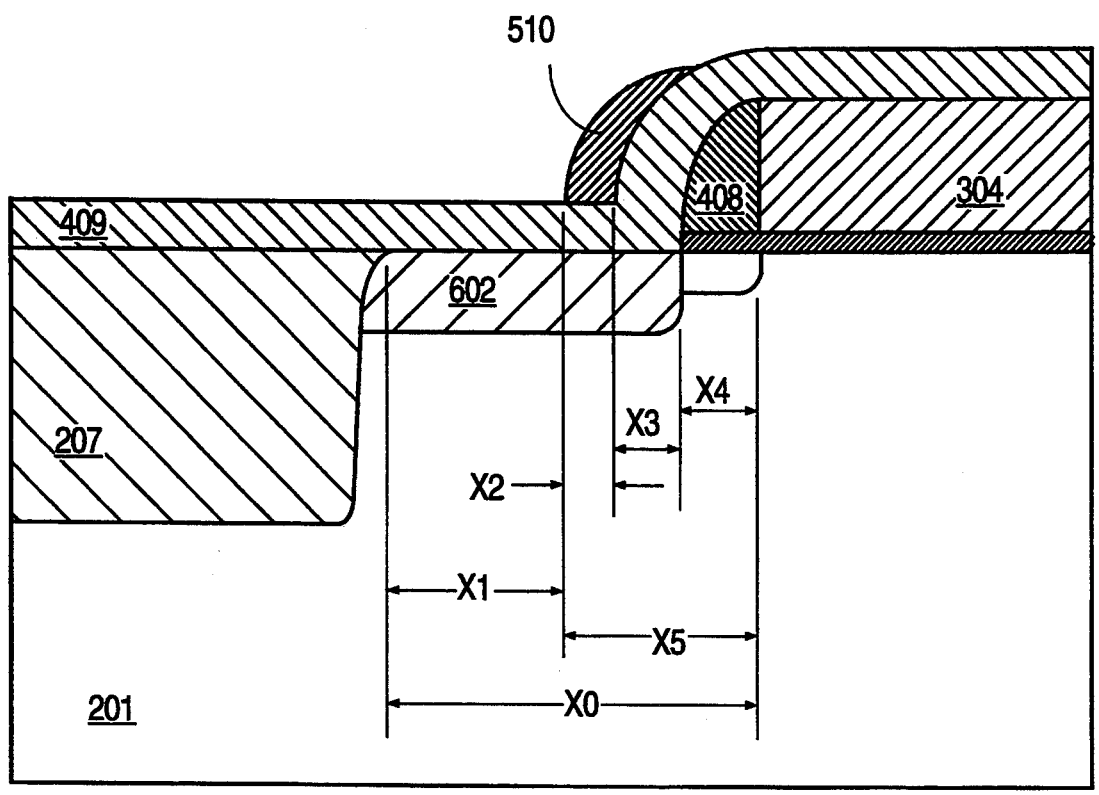
FIG. 9 shows a expanded portion of the cross-sectional view of FIG. 5.

FIG. 9 shows a portion of FIG. 5 and indicates a typical spacing achievable in a transistor in accordance with the invention. In FIG. 9, spacer 408 has a width X4 of about 0.2 $\mu$m. Polysilicon layer 409 and spacer 510 have respective widths X3 and X2 of 0.15 and 0.05 $\mu$m. As disclosed above with regard to FIGS. 5 and 6, spacer 510 and the portions of layer 409 under spacer 510 are etched away leaving a total distance X5 of about 0.4 $\mu$m between polysilicon source/drain contact 709A and polysilicon gate 304. The distance X5 is not subject to variations caused by alignment errors between masks because spacers 510 and 408 are self-aligned with gate 304 and define the location of source/drain contact 709A. The precision of the distance X5 is limited by the precision of the thickness of layer 409 and spacer 510 and the precision of the etching techniques used to remove spacers 510 and the underlying portions of polysilicon layer 409.

The distance X0 from the edge of isolation region 207 to the edge of gate 304 is about 0.7 $\mu$m and is subject to alignment error between a mask for field oxide region 207 and a mask for polysilicon gate 304. Accordingly, the length X1 of contact between polysilicon source/drain contact 709A and source/drain region 602 is about 0.3 $\mu$m and is subject to alignment error between masks.

Although the present invention has been described with reference to particular embodiments, the description is only an example of the invention's application and should not be taken as a limitation. In particular, even though much of preceding disclosure was directed to an N-channel enhancement mode transistor formed in the surface of a monocrystalline silicon substrate, the present invention is not so limited. In light of the above disclosure, it will be understood by those skilled in the art that N-channel or P-channel and enhancement mode or depletion mode field effect transistors can also be formed in accordance with the present invention. Further, transistors are not limited to being formed in the surface of monocrystalline silicon. Transistors in accordance with the present invention can be formed in polycrystalline silicon and other semiconductor materials including for example, gallium-arsenide.

In addition, although the disclosed embodiments employ a first spacer that is silicon dioxide or silicon nitride, a second spacer that is silicon nitride, and a protective silicon dioxide layer that covers portions of the source/drain contact layer not covered by the second spacer, embodiments of the present invention are not limited to these materials. In another embodiment, the second spacer and the protective layer are formed using materials such that a selective etch is available to remove the second spacer without removing the protective layer. The first spacer can generally be made of any insulating material or omitted completely or replaced by a reoxidation layer.

It will also be understood that the order of processing steps disclosed may be varied from the disclosed order when practicing processes in accordance with the present invention. Accordingly, various modifications, adaptations, substitutions, and combinations of different features of the specific embodiments disclosed can be practiced without departing from the scope of the invention set forth in the appended claims.

We claim:

1. A process for making a transistor, comprising the steps of:
   forming a gate overlying a semiconductor surface;
   forming a first spacer on a sidewall of the gate;
   forming a source/drain region in the semiconductor surface;
   forming a conducting layer in electrical contact with the source/drain region and overlying the first spacer and the gate, wherein a step is formed in the conducting layer near the gate and the first spacer;
   forming a second spacer on the step in the conducting layer;
   forming a protective layer on a portion of the conductive layer not covered by the second spacer;
   removing the second spacer to expose a portion of the conductive layer covered by the second spacer but leave covered the portion of the conducting layer covered by the protective layer; and
   removing the exposed portion of the conductive layer to leave a portion of the conductive layer in contact with the source/drain region and electrically isolated from the gate.

2. The process of claim 1, wherein the step of forming a conducting layer comprises the step of depositing a silicide layer in contact with the source/drain region and overlying the semiconductor surface and the gate.

3. The process of claim 2, wherein the step of depositing a silicide layer comprises sputtering from a target which comprises a metal-silicon compound.

4. The process of claim 1, wherein the step of forming a conducting layer comprises the step of depositing a polysilicon layer in contact with the source/drain region and overlying the semiconductor surface and the gate.

5. The process of claim 4, further comprising the step of forming silicide on the polysilicon layer.

6. The process of claim 4, wherein the step of forming a second spacer comprises the steps of:
   depositing a layer of silicon nitride on the polysilicon layer; and
   anisotropically etching the silicon nitride layer to remove silicon nitride from a portion of the polysilicon layer.

7. The process of claim 6, wherein the step of forming a protective layer comprises the step of thermally growing silicon dioxide on the portion of the polysilicon layer not covered by the second spacer.

8. The process of claim 1, wherein the step of forming the gate comprises the steps of:
   depositing an insulating layer on the semiconductor surface;
   depositing a polysilicon layer on the insulating layer;
   masking the polysilicon layer to protect a first region of the polysilicon layer and leave exposed a second region of the polysilicon layer;
   etching the polysilicon layer to remove the second region but leave the first region; and
   etching the insulating layer to expose a portion of the semiconductor surface.

9. The process of claim 8, wherein the step of forming the source/drain region comprises using the first region as a mask during implanting an impurity of a first dopant type.

10. The process of claim 9, wherein the step of forming a conducting layer comprises the step of depositing a second polysilicon layer, the second polysilicon layer being in contact with the source/drain region and overlying the semiconductor surface and the gate.

11. The process of claim 10, further comprising the step of forming a silicide on the second polysilicon layer.

12. The process of claim 10, wherein the step of forming a second spacer comprises the steps of:
   depositing a layer of silicon nitride on the second polysilicon layer; and
   anisotropically etching the silicon nitride layer to remove silicon nitride from a portion of the second polysilicon layer.

13. The process of claim 12, wherein the step of forming a protective layer comprises the step of thermally growing silicon dioxide on the portion of the second polysilicon layer not covered by the second spacer.

14. The process of claim 10, wherein the step of forming a conducting layer further comprises the step of doping the second polysilicon layer with an impurity of the first dopant type.

15. The process of claim 14, wherein the step of forming the source/drain region further comprises the step of diffusing a portion of the impurity from the second polysilicon layer into the semiconductor surface.

16. The process of claim 1, wherein:
   the second spacer comprises silicon nitride; and
   the protective layer comprises silicon dioxide.

17. The process of claim 1, wherein the step of forming the source/drain region further comprises the step of using the gate as a mask for controlling implantation of an impurity into the semiconductor surface.

18. The process of claim 17, further comprising the step of doping the conducting layer with an impurity, wherein the step of forming the source/drain region further comprises the step of diffusing a portion of the impurity from the conducting layer into the semiconductor surface.

* * * * *